(12) United States Patent  (10) Patent No.: US 8,237,192 B2
Sorg et al.  (45) Date of Patent: Aug. 7, 2012

(54) LIGHT EMITTING DIODE CHIP WITH OVERVOLTAGE PROTECTION

(75) Inventors: Joerg Erich Sorg, Regensburg (DE); Stefan Gruber, Bad Abbach (DE); Georg Bogner, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 131 days.

(21) Appl. No.: 12/742,064

(22) PCT Filed: Dec. 9, 2008

(86) PCT No.: PCT/DE2008/002058
§ 371 (c)(1),
(2), (4) Date: May 7, 2010

(87) PCT Pub. No.: WO2009/079983
PCT Pub. Date: Jul. 2, 2009

(65) Prior Publication Data
US 2010/0270578 A1    Oct. 28, 2010

(30) Foreign Application Priority Data

Dec. 20, 2007  (DE) .................. 10 2007 061 479

(51) Int. Cl.
*H01L 28/74* (2006.01)
*H01L 31/111* (2006.01)
(52) U.S. Cl. ........... 257/173; 257/199; 257/E21.006; 257/E21.053; 257/E21.17; 257/E21.352; 257/E21.215; 257/E21.218; 438/30; 438/141

(58) Field of Classification Search .......... 257/79, 257/88, 104, 199, 200, 201, 173, 288, 293, 257/E21.006, E21.053, E21.17, E21.215, 257/E21.218, E21.352
See application file for complete search history.

(56) References Cited

U.S. PATENT DOCUMENTS

| | | | |
|---|---|---|---|
| 5,591,661 A * | 1/1997 | Shiota | 438/200 |
| 6,445,011 B1 * | 9/2002 | Hirano et al. | 257/99 |
| 6,621,126 B2 * | 9/2003 | Russ | 257/355 |
| 7,057,215 B1 * | 6/2006 | Vashchenko et al. | 257/173 |
| 2002/0024053 A1 | 2/2002 | Inoue et al. | |
| 2005/0242358 A1 | 11/2005 | Tu et al. | |
| 2006/0071229 A1 | 4/2006 | Guenter | |
| 2006/0181828 A1 | 8/2006 | Sato et al. | |
| 2007/0262386 A1 * | 11/2007 | Gossner et al. | 257/355 |
| 2009/0279218 A1 | 11/2009 | Ferru | |

FOREIGN PATENT DOCUMENTS

EP    1 601 019 A2    11/2005
WO    WO 2007/122548 A2    11/2007
* cited by examiner

*Primary Examiner* — David Nhu
(74) *Attorney, Agent, or Firm* — Slater & Matsil, L.L.P.

(57) ABSTRACT

A light emitting diode chip includes a device for protection against overvoltages, e.g., an ESD protection device. The ESD protection device is integrated into a carrier, on which the semiconductor layer sequence of the light emitting diode chip is situated, and is based on a specific doping of specific regions of said carrier. By way of example, the ESD protection device is embodied as a Zener diode that is connected to the semiconductor layer sequence by means of an electrical conductor structure.

19 Claims, 3 Drawing Sheets

LIGHT EMITTING DIODE CHIP WITH OVERVOLTAGE PROTECTION

This patent application is a national phase filing under section 371 of PCT/DE2008/002058, filed Dec. 9, 2008, which claims the priority of German patent application 10 2007 061 479.0, filed Dec. 20, 2007, each of which is incorporated herein by reference in its entirety.

BACKGROUND

Optoelectronic components can be destroyed by electrostatic discharge, abbreviated to ESD. In the case of a light emitting diode chip, alternating electric fields can, for example, also cause damage even in the course of incorporation into a printed circuit board or into a housing.

SUMMARY

One aspect is to protect a light emitting diode chip against overvoltages in conjunction with a minimum additional space requirement.

A light emitting diode chip is specified. A device provides protection against overvoltages. The device is referred to hereinafter as an ESD protection device.

A light emitting diode chip includes a semiconductor layer sequence situated on a carrier. An ESD protection device is integrated into the carrier substrate by means of the doping of specific regions of the substrate.

In one embodiment, the light emitting diode chip is a thin-film light emitting diode chip. Here, the semiconductor layer sequence is grown onto a substrate containing sapphire, for example. That side of the semiconductor layer sequence which is remote from the growth substrate is connected to a further carrier substrate. The growth substrate can then be completely or partly removed.

The semiconductor layer sequence has a lower and an upper contact region for the purpose of making electrical contact. One or else both of the contact regions can include a transparent conductive oxide, for example, which is also referred to in abbreviated form as TCO material. In a further embodiment, at least one of the contact regions includes a metal or a metallic alloy. Suitable metals are, e.g., palladium, platinum, nickel, gold, silver, aluminum, rhodium, titanium or an alloy including at least one of these materials.

The lower contact region is preferably fixed on the carrier by means of an electrically conductive material, for example, a solder or an electrically conductive adhesive.

In one preferred embodiment, the carrier substrate includes semiconductor materials such as silicon, silicon carbide, gallium arsenide, gallium nitride or germanium. That partial region of the carrier which lies outside the ESD protection device is electrically conductive. In this case, the conductivity can be increased by a p-type doping or an n-type doping. For the purpose of making electrical contact, an electrical connection pad is preferably situated on a side of the carrier that is remote from the semiconductor layer sequence. The connection pad can be connected to a conductor track structure of a printed circuit board.

In another embodiment, the carrier is electrically insulating and includes materials such as aluminum nitride or sapphire, for example. In this case, electrical contact can be made by means of plated-through holes through the carrier which include an electrically conductive material.

Electrical contact is made with the upper contact region of the semiconductor layer sequence by means of a bonding wire, for example. For this purpose, a metalized layer, the so-called bonding pad, is applied to a partial region of the upper contact region. The bonding pad preferably contains a metal or a metallic alloy, particularly preferably gold.

An electrically conductive connecting material is fixed to the bonding pad. By way of example, a bonding wire is soldered on, which can be electrically connected at its other end to a connection region on a printed circuit board.

The ESD protection device is preferably integrated into the carrier by specific partial regions of the carrier substrate being specifically doped.

An ESD protection device of this type protects the light emitting diode chip against electrical overvoltages, even before the chip is connected to possible further components, such as a printed circuit board, for example, or is incorporated into a housing.

The partial regions are electrically insulated from the remaining carrier substrate by means of a barrier layer. In order to produce the barrier layer, by way of example, a trench is etched into the substrate, the trench subsequently being filled with an insulating material such as silicon nitride, or silicon dioxide.

In one embodiment, the ESD protection is embodied as a diode.

For this purpose, a first region of the carrier substrate is n-doped, and a second region adjoining the first region is p-doped. If this diode is reverse-connected in parallel with the semiconductor layer sequence, then the light emitting diode chip is protected against overvoltages at least in the reverse direction.

In one preferred embodiment, the doping of the carrier substrate is performed such that a diode having the characteristic curve of a Zener diode arises. In the forward direction, a Zener diode of this type has a characteristic curve corresponding to that of a normal diode. In the reverse direction, however, the Zener diode attains low impedance starting from a specific voltage. As a result, the electronic component, when reverse-connected in parallel with a Zener diode, is protected against overvoltages both in the forward direction and in the reverse direction.

In further embodiments, the ESD protection device can have the characteristic curve of other electronic components.

In one preferred embodiment, the ESD protection device is connected to the semiconductor layer sequence by means of an electrical conductor structure.

Particularly advantageously, those regions of the ESD protection device and of the semiconductor layer sequence which are respectively remote from the carrier are in this case reverse-connected in parallel with one another. The conductor structure is connected, for example, to the upper contact region of the semiconductor layer sequence.

The conductor structure is preferably produced by means of sputtering, vapor deposition or electrodeposition. By way of example, the electrical conductor structure can consist of a metal or partly include a metal. As an alternative to this, a TCO material or a transparent electrically conductive plastic layer can also be used. Materials of this type are preferably applied by vapor deposition, printing on, spraying on or spin-coating.

In a further embodiment, the electrical conductor structure is partly or completely enclosed by an insulation layer.

The layer is situated at least between the conductor structure and that layer of the semiconductor layer sequence which does not adjoin the upper contact region of the semiconductor layer sequence. A possible short circuit of these components can thus be prevented. The insulation layer includes silicon nitride, for example.

In one preferred embodiment, the semiconductor layer sequence and the substrate are encapsulated with the electrical insulation layer.

The electronic component can thereby be protected against chemical and mechanical influences. Suitable materials for an insulation layer of this type are glass, plastic or silicone, for example. The respective material can be applied, for example, as a prefabricated layer or by printing on, spraying on or spin-coating.

The electrical conductor structure is situated on the electrical insulation layer or is enclosed by the latter.

For the purpose of making electrical contact with the semiconductor layer sequence and the ESD protection device, cutouts are introduced into the insulation layer. The conductor structure is connected to the connection regions of the ESD protection device and of the semiconductor layer sequence, respectively, through the cutouts. This analogously also applies to further electrical connections, such as, for example, when making electrical contact with the bonding pad by means of a bonding wire.

The cutouts in the insulation layer are preferably introduced by means of laser processing. In order to produce the conductor structure, a metal layer is applied to the insulation layer, for example, by means of a PVD method, such as sputtering, for example. The metal layer can be reinforced by means of electrodeposition.

As an alternative, the conductor structure can also be applied using a printing method, in particular, a screen printing method. Furthermore, the electrically conductive material can also be produced using a spraying-on method or a spin-coating method.

After the formation of an electrical conductor structure, the latter can additionally be covered with an electrically insulating covering layer. The insulating covering layer is preferably a plastic layer, for example, a resist layer.

In accordance with at least one embodiment of the light emitting diode chip, the ESD protection device has, in a direction parallel to a growth direction of the semiconductor layer sequence, at least one n-doped partial region and at least one p-doped partial region. Preferably, the protection device includes exactly one such n-doped partial region and exactly one such p-doped partial region. Furthermore, these doped partial regions, in a direction parallel to the growth direction of the semiconductor layer sequence, are arranged congruently, in particular. In other words, the p- and n-doped partial regions can lie exactly one above another.

In accordance with at least one embodiment of the light emitting diode chip, at least one doped partial region of the ESD protection device is separated from remaining partial regions of the carrier by the barrier layer. In other words, there is no direct contact between a material of the at least one doped partial region and a material of the remaining partial region of the carrier.

In accordance with at least one embodiment of the light emitting diode chip, the doped partial regions of the ESD protection device are completely separated by the barrier layer from the remaining partial region of the carrier and are not in direct electrical contact with the remaining partial region of the carrier. Completely separated means that there is no direct contact between the material of the doped partial regions and the material of the remaining partial region of the carrier. The fact that there is no direct electrical contact means that no direct current flow takes place between the doped partial regions and the remaining partial region of the carrier. A current flow for instance from the doped partial regions to the remaining partial region of the carrier therefore takes place, for example, indirectly via the semiconductor layer sequence or via a connection pad situated at that side of the carrier which is remote from the semiconductor layer sequence.

In accordance with at least one embodiment of the light emitting diode chip, the barrier layer, in a direction parallel to the growth direction of the semiconductor layer sequence, extends into the semiconductor layer sequence to the extent of at least 20% and to the extent of at most 80%, in particular, as seen from that side of the carrier which faces the semiconductor layer sequence.

In accordance with at least one embodiment of the light emitting diode chip, a main extension direction of the barrier layer is oriented parallel to the growth direction of the semiconductor layer sequence.

In accordance with at least one embodiment of the light emitting diode chip, the barrier layer is formed by the trench. The trench is produced by means of deep reactive ion etching, for example.

In accordance with at least one embodiment of the light emitting diode chip, the trench is filled with a dielectric solid, in particular, with silicon oxide or silicon nitride.

In accordance with at least one embodiment of the light emitting diode chip, the trench is filled with a gas, in particular, with air.

In accordance with at least one embodiment of the light emitting diode chip, the trench is produced by deep reactive ion etching and has patterned walls. Such patterned walls enable, for example, a better adhesion of a material which is filled into the trench. The material can be silicon oxide or silicon nitride, for instance.

In accordance with at least one embodiment of the light emitting diode chip, the barrier layer is formed by a pn junction. In particular, the pn junction has a space charge zone which occurs at an interface between the, for example, p-doped partial region of the ESD protection device and the remaining, for example, n-doped partial region of the carrier.

BRIEF DESCRIPTION OF THE DRAWINGS

The specified semiconductor chip and advantageous configurations are explained below with reference to schematic figures that are not true to scale, in which:

FIG. 5, show a schematic representation of a process for producing a barrier layer of a semiconductor chip, which barrier layer is configured as a trench.

Elements which are identical, of identical type and act identically are provided with identical reference symbols in the figures.

DETAILED DESCRIPTION OF ILLUSTRATIVE EMBODIMENTS

Figure 1:
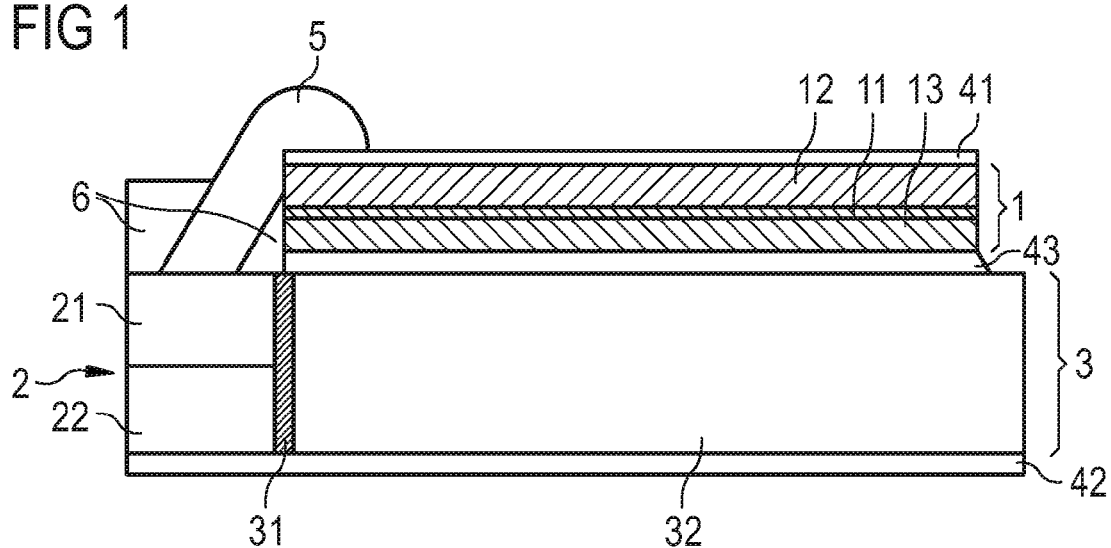
FIG. 1 shows a sectional view of a semiconductor chip with a Zener diode integrated in the carrier.

FIG. 1 shows an embodiment of the light emitting diode chip comprising an ESD protection device 2. A semiconductor layer sequence 1, including an active layer 11 for generating electromagnetic radiation, is arranged on a carrier 3. By way of example, the layer 12 of the semiconductor layer sequence 1 is n-doped and the further layer 13 is p-doped.

Preferably, the light emitting diode chip is a thin-film light emitting diode chip in which a growth substrate for the semiconductor layer sequence 1 has been completely or partly removed. In particular, the carrier 3 is different from the growth substrate.

An ESD protection device 2 is integrated into the carrier 3, the ESD protection device having been produced by means of doping of two partial regions 21, 22 of the carrier 3. The ESD protection device 2 is embodied here as a Zener diode, wherein the first region 21 of the ESD protection device 2 is p-doped and the second region 22 is n-doped.

An electrical conductor structure 5 connects the ESD protection device 2 to the upper contact region 41 of the semiconductor layer sequence 1. With the components being reverse-connected in parallel in the manner thus realized, the light emitting diode chip is protected against overvoltages both in the forward direction and in the reverse direction.

The electrical conductor structure 5 includes a metal, a TCO material or plastic, for example.

The electrical conductor structure 5 is partly covered by an insulation layer 6, which can include silicon nitride. This layer 6 is situated at least between the electrical conductor structure 5 and that layer 13 of the semiconductor layer sequence which does not adjoin the upper contact region 41. As a result, a possible short circuit of these components can be prevented.

In one preferred embodiment, the semiconductor layer sequence 1 and the substrate 3 are encapsulated with the electrical insulation layer. The electrical conductor structure 5 is situated on the insulation layer or is enclosed by the latter.

The ESD protection device 2 is electrically insulated or completely separated from the remaining carrier substrate 32 by a barrier layer 31, such that a material of the partial regions 21, 22 is not in direct electrical contact with the remaining partial region 32 of the carrier 3. In order to produce the barrier layer 31, by way of example, a trench is etched into the substrate 3, the trench subsequently being filled with an insulating material, for example, silicon nitride or silicon dioxide. The trench penetrates through the carrier 3, in a direction parallel to a growth direction of the semiconductor layer sequence 1, completely.

For the purpose of making electrical contact, the semiconductor layer sequence 1 has a lower 43 and an upper 41 contact region. One or else both of the contact regions can include a transparent conductive oxide, for example. In one embodiment, at least one of the contact regions includes a metal or a metallic alloy. Suitable metals are, for example, palladium, platinum, nickel, gold, silver, aluminum, rhodium, titanium or an alloy including at least one of these materials.

The lower contact region 43 is preferably fixed on the carrier substrate 3 by means of an electrically conductive material, for example, a solder or an electrically conductive adhesive.

In one preferred embodiment, the carrier 3 includes semiconductor materials such as silicon, silicon carbide, gallium arsenide, gallium nitride or germanium. That partial region 32 of the carrier 3 which lies outside the ESD protection device 2 is electrically conductive. In this case, the conductivity can be increased by a p-type doping or an n-type doping. For the purpose of making electrical contact, the carrier 3 has an electrical connection pad 42 on a side remote from the semiconductor layer sequence 1. The connection pad 42 can be connected to a conductor track structure of a printed circuit board.

Figure 2:
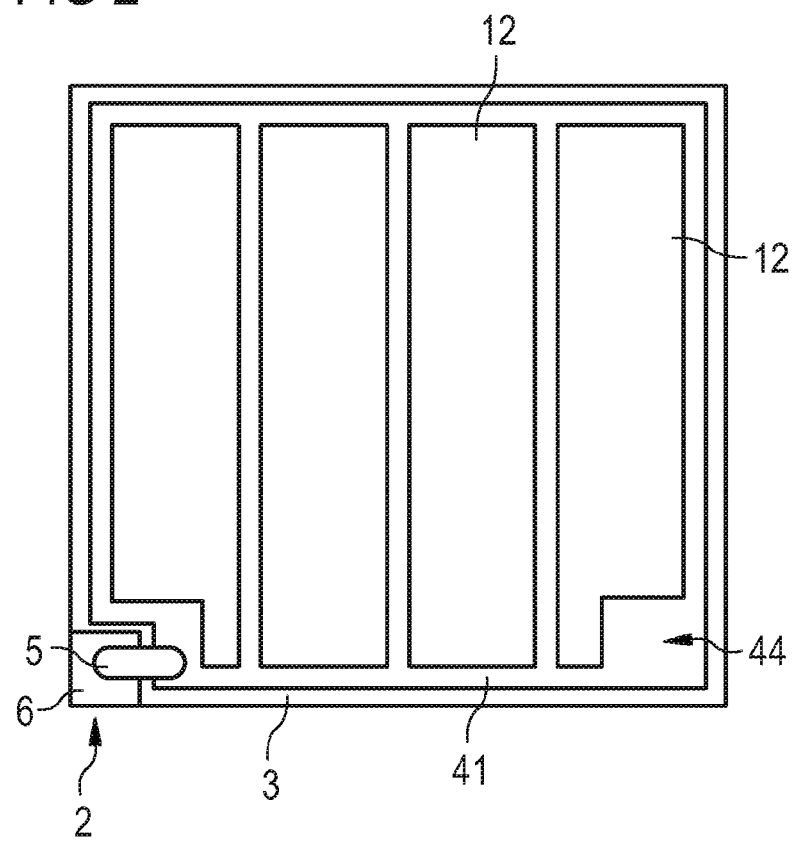
FIG. 2 shows a plan view of the semiconductor chip in accordance with FIG. 1.

FIG. 2 shows a plan view of the semiconductor chip in accordance with FIG. 1. That layer 12 of the semiconductor layer sequence 1 which is remote from the carrier 3 occupies a large part of the region illustrated. Furthermore, the upper electrical contact region 41 and the electrical connection pad 44 can be seen. The connection pad 44 can be embodied here as a metalized layer, a so-called bonding pad, which includes gold, for example. An electrically conductive connection, for example, a bonding wire, can be soldered onto the connection pad 44, which bonding wire can be electrically connected at its other end to a further connection region on a printed circuit board.

The carrier 3 is not covered by the semiconductor layer sequence 1 in the edge regions of the illustration and can thus be discerned in the plan view. In the bottom left corner of the plan view, the semiconductor layer sequence 1 has a cutout. The ESD protection device 2 is situated here, the ESD protection device being covered by the insulation layer 6. The electrical conductor structure 5 connects the ESD protection device 2 to the upper contact region 41 of the semiconductor layer sequence 1 through the insulation layer 6.

Figure 3:
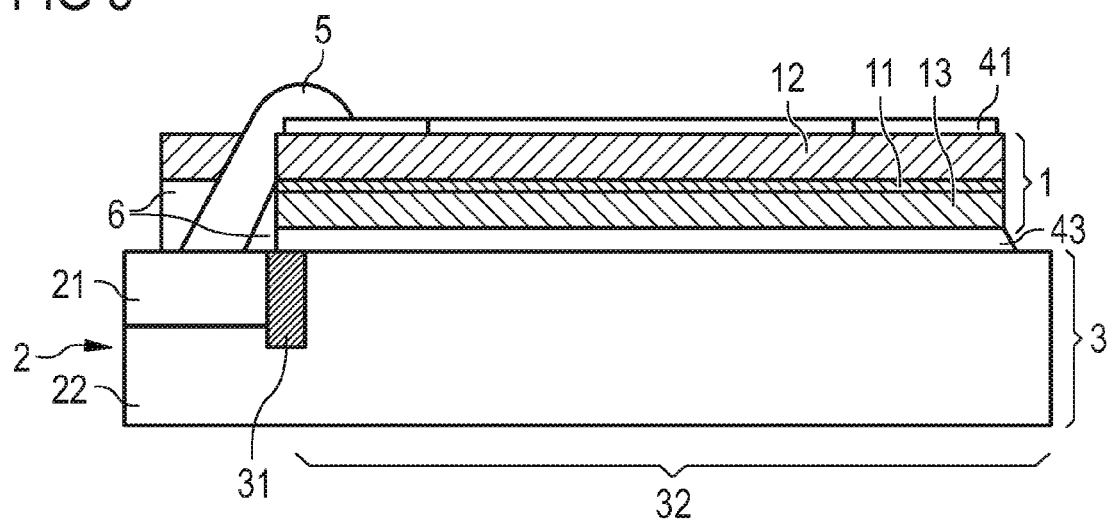
FIG. 3 shows a sectional view of a semiconductor chip with a barrier layer that does not completely penetrate through the carrier.

FIG. 3 shows an exemplary embodiment of the light emitting diode chip analogously to FIG. 1. The carrier 3 is n-doped in this case. The barrier layer 31 extends, as viewed from a side of the carrier 3 which faces the semiconductor layer sequence 1, into the carrier 3 to the extent of approximately 50%. The barrier layer 31 is formed by a trench filled with silicon nitride or with air, for example. The p-doped partial region 21 of the ESD protection device 2 is separated from the remaining partial region 32 of the carrier 3 by the barrier layer 31, that is to say that the materials of the partial regions 21, 22 are not in direct contact with one another. Furthermore, the partial regions 21, 22 of the ESD protection device 2, in a direction parallel to the growth direction of the semiconductor layer sequence 1, are situated one above the other.

Figure 4:
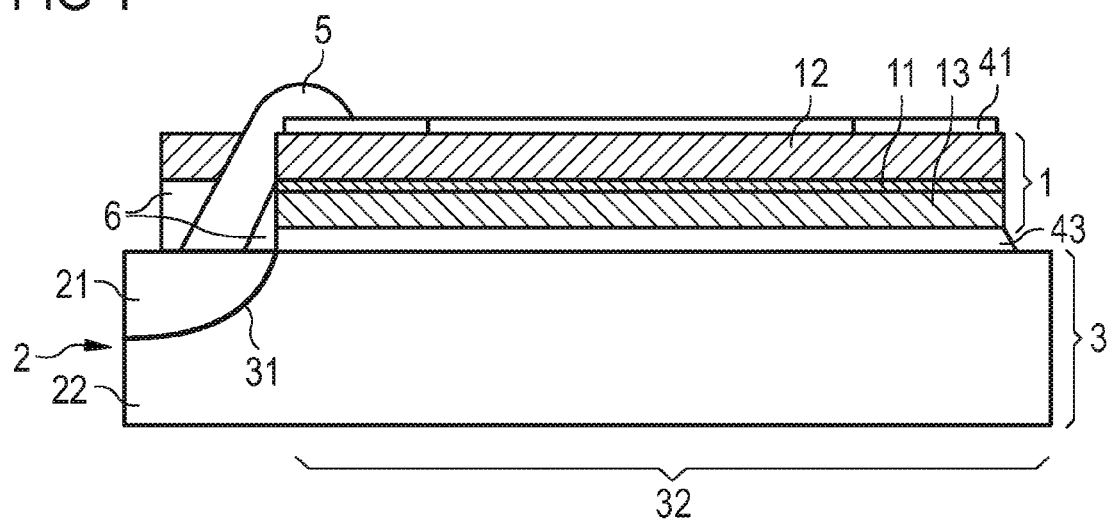
FIG. 4 shows a sectional view of a semiconductor chip in which the barrier layer is formed by a pn junction.

In the exemplary embodiment in accordance with FIG. 4, the barrier layer 31 is formed by a pn junction between the p-doped partial region 21 and the n-doped partial region 22 of the ESD protection device 2 and the remaining partial region 32 of the carrier 3. In this case, that layer 13 of the semiconductor layer sequence 1 which faces the carrier 3 is preferably p-doped, and that layer 12 of the semiconductor layer sequence which is remote from the carrier 3 is preferably n-doped.

During normal operation of the light emitting diode chip, by way of example, a positive voltage is present at the carrier 3 and a negative voltage is present at the upper contact region 41. A current flow therefore takes place via the upper contact region 41, via the n-doped layer 12, via the active layer 11, via the p-doped layer 13 and via the lower contact region 43 and also, if appropriate, via the carrier 3. Since the p-doped partial region 21 is connected to the upper contact region 41, which is connected as a cathode, no current flow from the p-doped partial region 21 to the n-doped partial region 22 takes place during normal operation of the light emitting diode chip.

If the light emitting diode chip is not in operation, such that no defined, external voltage is applied, then it is possible, upon the occurrence of a voltage in the reverse direction of the semiconductor layer sequence 1 in the ESD case, for a current to flow away via the doped partial regions 21, 22, with the result that destruction of the light emitting diode chip is avoided.

A production method for the barrier layer 31 is illustrated schematically in FIG. 5. In accordance with FIG. 5A, a photoresist 9 is applied on the carrier 3 in patterned fashion. Regions in which the barrier layer 31 is intended to be formed are not covered by the photoresist 9.

Figure 5A:
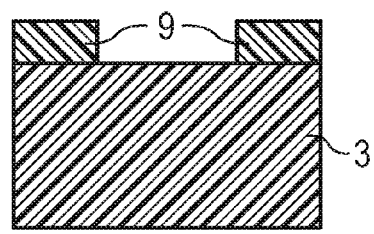
FIGS. 5A-5F, collectively
Figure 5B:
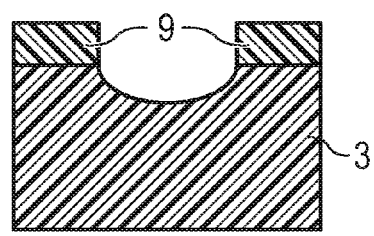

In accordance with FIG. 5B, etching is effected by means of deep reactive ion etching, such that material of the carrier 3 is removed in regions not covered by the photoresist and a trench 7 results. However, the trench 7 has only a small depth.

Figure 5C:
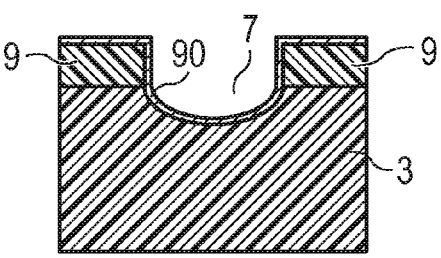

In a next process step, illustrated in FIG. 5C, a passivation 90 is applied over the photoresist 9 and over the trench 7.

Figure 5D:
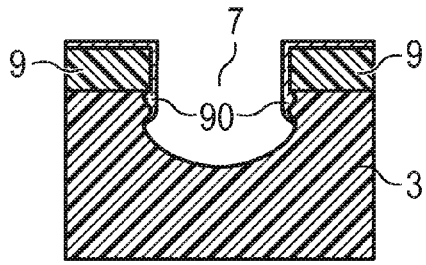

As can be seen in FIG. 5D, the passivation 90 is removed in regions to be etched, such that the trench 7 is deepened in the subsequent etching step.

Figure 5E:
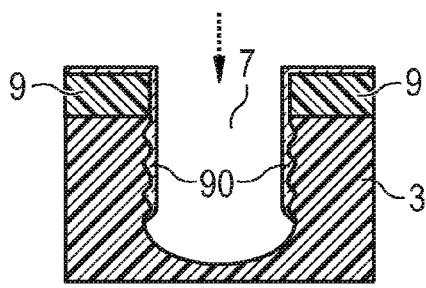
Figure 5F:
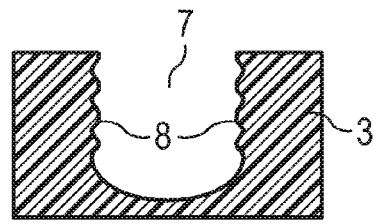

The method steps in accordance with FIGS. 5C and 5D are repeated as often as until a desired depth of the trench 7 is attained, see FIG. 5E.

Finally, passivation 90 and photoresist 9 are removed, such that the carrier 3 and the trench 7 having the desired depth lie free. On account of the iterative etching of the trench 7, walls 8 of the trench 7 have a patterning. This patterning enables, for example, in an optional, further method step, in which a material is introduced into the trench 7, a better adhesion of this material to the walls 8 and thus in the trench 7.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

| List of Reference Symbols | |
|---|---|
| 1 | Semiconductor layer sequence |
| 11 | Active layer |
| 12 | Layer of the semiconductor layer sequence that is remote from the carrier |
| 13 | Layer of the semiconductor layer sequence that faces the carrier |
| 2 | ESD protection device |
| 21 | p-doped region of the protection device |
| 22 | n-doped region of the protection device |
| 3 | Carrier |
| 31 | Barrier layer |
| 32 | Remaining carrier substrate, not associated with the protection device |
| 41 | Upper contact region |
| 42 | Connection pad |
| 43 | Lower contact region |
| 44 | Electrical connection pad |
| 5 | Electrical conductor structure |
| 6 | Insulation layer |
| 7 | Trench |
| 8 | Walls of the trench |
| 9 | Photoresist |
| 90 | Passivation |

The invention claimed is:

1. A light emitting diode chip comprising:
a carrier;
a semiconductor layer sequence situated on the carrier;
an ESD protection device, which protects the light emitting diode chip against overvoltages, wherein the ESD protection device comprises doped regions of the carrier, wherein the ESD protection device has, in a direction parallel to a growth direction of the semiconductor layer sequence, at least one n-doped partial region and at least one p-doped partial region; and
a barrier layer, wherein at least one doped partial region of the ESD protection device is separated from a remaining partial region of the carrier by the barrier layer.

2. The light emitting diode chip according to claim 1, wherein the ESD protection device comprises a diode.

3. The light emitting diode chip according to claim 2, wherein the ESD protection device comprises a Zener diode.

4. The light emitting diode chip according to claim 1, further comprising an electrical conductor structure, wherein the ESD protection device is connected to the semiconductor layer sequence by means of the electrical conductor structure.

5. The light emitting diode chip according to claim 4, further comprising an insulation layer at least partially covering the electrical conductor structure.

6. The light emitting diode chip according to claim 4, wherein the semiconductor layer sequence and the carrier are covered at least partly by an insulation layer, the electrical conductor structure situated on the insulation layer.

7. The light emitting diode chip according to claim 1, wherein the at least one doped partial region of the ESD protection device is completely separated by the barrier layer from the remaining partial region of the carrier and is not in direct electrical contact with the remaining partial region.

8. The light emitting diode chip according to claim 1, wherein the barrier layer, in a direction parallel to a growth direction of the semiconductor layer sequence, penetrates through the carrier at least to the extent of 20% and at most to the extent of 80%.

9. The light emitting diode chip according to claim 1, wherein the barrier layer is formed by a trench filled with a silicon oxide or a silicon nitride.

10. The light emitting diode chip according to claim 9, wherein the trench forming the barrier layer is filled with a gas.

11. The light emitting diode chip according to claim 1, wherein the barrier layer is formed by a pn junction.

12. A method of forming a light emitting diode chip, the method comprising:
forming a semiconductor layer sequence situated on a carrier; and
doping regions of the carrier to form an ESD protection device, which protects the light emitting diode chip against overvoltages, wherein the ESD protection device has, in a direction parallel to a growth direction of the semiconductor layer sequence, at least one n-doped partial region and at least one p-doped partial region; and
forming a barrier layer, wherein at least one doped partial region of the ESD protection device is separated from a remaining partial region of the carrier by the barrier layer.

13. The method according to claim 12, further comprising forming an electrical conductor structure to electrically connect the ESD protection device to the semiconductor layer sequence, wherein forming the electrical conductor structure comprises forming the electrical conductor structure by sputtering, vapor deposition or electrodeposition.

14. The method according to claim 12, further comprising performing deep reactive ion etching to form a trench to separate at least one doped partial region of the ESD protection device from a remaining partial region of the carrier.

15. The method according to claim 12, wherein the ESD protection device comprises a diode.

16. The method according to claim 15, wherein the ESD protection device comprises a Zener diode.

17. The method according to claim 12, wherein forming the barrier comprises forming a pn junction.

18. The method according to claim 12, wherein forming the barrier comprises forming a trench filled with a silicon oxide or a silicon nitride.

19. The method according to claim 12, wherein forming the barrier comprises forming a trench filled with a gas.

* * * * *